(12) United States Patent
Chen et al.

(10) Patent No.: US 9,991,895 B2
(45) Date of Patent: Jun. 5, 2018

(54) WIRELESS RADIO-FREQUENCY TRANSMISSION APPARATUS

(71) Applicant: INSTITUTE OF SEMICONDUCTORS, CHINESE ACADEMY OF SCIENCES, Beijing (CN)

(72) Inventors: Jingjing Chen, Beijing (CN); Nanjian Wu, Beijing (CN); Haiyong Wang, Beijing (CN); Weiyang Liu, Beijing (CN); Peng Feng, Beijing (CN)

(73) Assignee: INSTITUTE OF SEMICONDUCTORS, CHINESE ACADEMY OF SCIENCES, Beijing (CN)

( * ) Notice: Subject to any disclaimer, the term of this patent is extended or adjusted under 35 U.S.C. 154(b) by 0 days. days.

(21) Appl. No.: 15/321,991

(22) PCT Filed: Jun. 26, 2014

(86) PCT No.: PCT/CN2014/080802
§ 371 (c)(1),
(2) Date: Dec. 23, 2016

(87) PCT Pub. No.: WO2015/196406
PCT Pub. Date: Dec. 30, 2015

(65) Prior Publication Data
US 2017/0141780 A1 May 18, 2017

(51) Int. Cl.
*H03L 7/089* (2006.01)
*H04B 1/04* (2006.01)
(Continued)

(52) U.S. Cl.
CPC ............ *H03L 7/0891* (2013.01); *H03L 7/099* (2013.01); *H04B 1/04* (2013.01); *H04B 1/403* (2013.01);
(Continued)

(58) Field of Classification Search
CPC ......... H03L 7/0891; H03L 7/099; H04B 1/04; H04B 1/16; H04B 1/38; H04B 1/40;
(Continued)

(56) References Cited

U.S. PATENT DOCUMENTS 6,816,559 B1 * 11/2004 Sirito-Olivier ........... H04L 1/24
375/146
7,593,695 B2 * 9/2009 Jensen .................. H03L 7/0891
375/140
(Continued)

FOREIGN PATENT DOCUMENTS

CN 101741379 6/2010
CN 101820250 9/2010
(Continued)

OTHER PUBLICATIONS

International Search Report issued for PCT/CN2014/080802, dated Mar. 27, 2015, 2 pages. English translation.
(Continued)

*Primary Examiner* — Betsy Deppe
(74) *Attorney, Agent, or Firm* — Hamre, Schumann, Mueller & Larson, P.C.

(57) ABSTRACT

A wireless radio-frequency transmission apparatus includes a phase frequency detector, a charge pump, a loop filter and a twin voltage-controlled oscillator. The twin voltage-controlled oscillator includes a first oscillator and a second oscillator. When the twin voltage-controlled oscillator is in a reception mode, the first and the second oscillators are coupled to each other to form a quadrature voltage-con-
(Continued)

trolled oscillator, and the quadrature voltage-controlled oscillator, the phase frequency detector, the charge pump and the loop filter constitute a phase-locked loop to generate quadrature carriers. When the twin voltage-controlled oscillator is in a transmission mode, the first oscillator, the phase frequency detector, the charge pump and the loop filter constitute a phase-locked loop, and the second oscillator performs frequency modulation on transmitted data. The present disclosure can maintain a carrier frequency to be stable during high data rate transmission, and have a relatively short locking time of frequency hopping.

8 Claims, 4 Drawing Sheets

(51) Int. Cl.
*H04B 1/403* (2015.01)
*H04L 27/12* (2006.01)
*H04L 27/152* (2006.01)
*H03L 7/099* (2006.01)
*H04L 7/033* (2006.01)

(52) U.S. Cl.
CPC .............. *H04L 7/033* (2013.01); *H04L 27/12* (2013.01); *H04L 27/152* (2013.01)

(58) Field of Classification Search
CPC ......... H04B 1/401; H04B 1/403; H04L 27/10; H04L 27/127; H04L 27/148; H04L 27/152; H04L 7/033; H04L 27/12; H04L 27/16

See application file for complete search history.

(56) References Cited

U.S. PATENT DOCUMENTS

| | | | |
|---|---|---|---|
| 2006/0104399 A1 | 5/2006 | Brun et al. | |
| 2007/0057740 A1* | 3/2007 | Ryu | H03B 27/00 331/45 |
| 2010/0330941 A1* | 12/2010 | Trikha | H04H 40/45 455/180.1 |

FOREIGN PATENT DOCUMENTS

| | | |
|---|---|---|
| CN | 102970053 | 3/2013 |
| CN | 103501175 | 1/2014 |
| CN | 104135276 | 11/2014 |

OTHER PUBLICATIONS

Chen et al., "A 2.4 GHz Energy-Efficient 18-MBPS FSK Transmitter in 0.18 μm CMOS", Institute of Semiconductors, Chinese Academy of Sciences, Beijing, China, 2013, 4 pages.

Chen et al., "A 2.4 GHz ultra-low power low-IF receiver and MUX-based transmitter for WPAN applications", Journal of Semiconductors, vol. 35, No. 6, Jun. 2014, 6 pages.

* cited by examiner

WIRELESS RADIO-FREQUENCY TRANSMISSION APPARATUS

TECHNICAL FIELD

The present disclosure relates to a field of wireless radio-frequency communication circuit technologies, and more particularly, to a field of radio-frequency communication circuits requiring high-speed transmission and high-energy efficiency.

BACKGROUND

With the rapid development of wireless communication technologies, there is an increasing demand for a low-power and high-speed radio-frequency transmission apparatus, for example, in application scenarios such as wireless capsule endoscopes, nerve recording etc. where a high data rate transmission is required.

Due to the constant envelope characteristics of frequency-shift keying modulation, a highly efficient nonlinear power amplifier can be utilized in a transmitter. Therefore, such modulation scheme is widely applied in scenarios where a low-power transmission is required.

Currently, transmitters available for frequency shift keying primarily comprise mixer structure-based transmitters and Phase-Locked Loop (PLL) structure-based transmitters. The mixer structure-based transmitters are highly flexible and can be used for different types of modulations. However, such structure requires high-power digital-to-analog converters and mixers, and therefore is not suitable for low-power applications.

The phase-locked loop structure-based transmitters are currently implemented in four ways on the whole. A first way is to apply a modulated signal to a frequency divider, which is simple and highly accurate. However, as a phase-locked loop presents low-pass filter characteristics for the modulated signal, a data transmission rate is limited by a loop bandwidth of the phase-locked loop. A second way is modulation with a closed-loop voltage-controlled oscillator, which directly applies modulated data to a locked voltage-controlled oscillator. In this case, a phase-locked loop presents high-pass filter characteristics for the modulated signal, and therefore low-frequency components of the modulated signal may be damaged. A third way is to add a modulated signal to a frequency divider and a voltage-controlled oscillator simultaneously, which is also called two-point modulation. This modulation way combines advantages of the two ways described above. In an ideal case, if a high-pass path exactly matches with a low-pass path, then a data transmission rate of a signal is not limited by a loop bandwidth of the phase-locked loop. However, the requirements for matching between both gains and bandwidths of the two signal paths increase the design complexity and power consumption of the system. A fourth way is modulation with an open-loop voltage-controlled oscillator, which firstly locks the voltage-controller oscillator at a certain transmission carrier frequency through a phase-locked loop, then disconnects the phase-locked loop, and directly applies a modulated signal to the voltage-controlled oscillator. In this way, a data transmission rate is free from limitations due to a loop bandwidth of the phase-locked loop. However, as the phase-locked loop is in an open-loop state during transmission, an oscillation frequency of the voltage-controlled oscillator is prone to frequency drift, which is generally caused by a leakage current, external interference and ambient temperature variation.

SUMMARY

Technical Problem to be Solved

The present disclosure primarily aims to provide a high-speed and low-power wireless radio-frequency transmission apparatus, which is capable of transmitting a signal at a high data rate while maintaining stability of a carrier, thereby enabling its applications in high data rate application scenarios such as medical electronics etc.

Solution to the Problem

The present disclosure provides a wireless radio-frequency transmission apparatus, comprising: a phase frequency detector, a charge pump, a loop filter and a twin voltage-controlled oscillator, wherein the twin voltage-controlled oscillator comprises a first voltage-controlled oscillator and a second voltage-controlled oscillator which are of the same structure, wherein when the twin voltage-controlled oscillator is in a reception mode, the first voltage-controlled oscillator and the second voltage-controlled oscillator are coupled to each other to form a quadrature voltage-controlled oscillator, and the quadrature voltage-controlled oscillator, the phase frequency detector, the charge pump and the loop filter constitute a phase-locked loop to generate quadrature carriers for receiving information; and when the twin voltage-controlled oscillator is in a transmission mode, the first voltage-controlled oscillator, the phase frequency detector, the charge pump and the loop filter constitute a phase-locked loop, and the second voltage-controlled oscillator is used for performing frequency modulation on transmitted data.

Wherein the twin voltage-controlled oscillator further comprises a first coupling branch and a second coupling branch, wherein the first voltage-controlled oscillator has an output end connected to input ends of the first coupling branch and the second coupling branch respectively, and the second voltage-controlled oscillator has an output end connected to the input ends of the first coupling branch and the second coupling branch respectively.

Wherein after current is applied to the first coupling branch and the second coupling branch, the first voltage-controlled oscillator and the second voltage-controlled oscillator are coupled through the first coupling branch and the second coupling branch to form the quadrature voltage-controlled oscillator and the twin voltage-controlled oscillator is switched to the reception mode; and after the current is cut off from the first coupling branch and the second coupling branch, the first voltage-controlled oscillator and the second voltage-controlled oscillator are decoupled and the twin voltage-controlled oscillator is switched to the transmission mode.

Wherein oscillation frequencies of the first voltage-controlled oscillator and the second voltage-controlled oscillator are controlled by a first frequency control signal.

Wherein the phase frequency detector, the charge pump and the loop filter adjust the first frequency control signal according to a feedback value of an output frequency of the twin voltage-controlled oscillator.

The apparatus further comprises:

a frequency presetting module configured to preset a frequency of the twin voltage-controlled oscillator when frequency hopping occurs in the phase-locked loop.

Wherein the frequency presetting module changes the first frequency control signal according to a first frequency preset control word.

Wherein the oscillation frequencies of the first voltage-controlled oscillator and the second voltage-controlled oscillator are further controlled by a second frequency preset control word.

Wherein the first frequency preset control word and the second frequency preset control word are preset according to a target frequency to which the twin voltage-controlled oscillator is intended to hop.

The apparatus further comprises: a digital processor configured to sample the output frequency of the twin voltage-controlled oscillator during the digital processor is powered-on, to acquire a correspondence relationship between the output frequency of the twin voltage-controlled oscillator and the first frequency preset control word, and a correspondence relationship between the output frequency of the twin voltage-controlled oscillator and the second frequency preset control word.

Advantageous Effects

It can be seen from the above-described technical solutions that the present disclosure has the following advantageous effects.

1. In the radio-frequency transmission apparatus according to the present disclosure, all circuits can be integrated with a single chip using a standard CMOS process, which has a simple system structure, and satisfies the requirements for a low cost in practical applications. Further, the transmitter realizes high data rate communication with low power consumption, which solves the problem of low power consumption in related applications.

2. In the radio-frequency transmission apparatus according to the present disclosure, as a twin voltage-controlled oscillator is utilized in the phase-locked loop, the phase-locked loop can operate in two different modes which are a reception mode and a transmission mode. In the reception mode, the twin voltage-controlled oscillator is in a quadrature coupling mode, and can provide quadrature carriers to the receiver; and in the transmission mode, the twin voltage-controlled oscillator is decoupled and oscillates independently. In this way, the overall hardware overhead of the transceiver can be reduced, and area saving and cost reduction are achieved.

3. In the radio-frequency transmission apparatus according to the present disclosure, in the transmission mode, the twin voltage-controlled oscillator is decoupled and oscillates independently, in which one voltage-controlled oscillator (iVCO) is locked by the phase-locked loop and the other voltage-controlled oscillator (qVCO) is not locked. A modulated signal is applied to the qVCO, so that a data transmission rate is free from limitations due to a loop bandwidth of the phase-locked loop while maintaining stability of a transmission carrier frequency.

4. In the radio-frequency transmission apparatus according to the present disclosure, a frequency presetting technology is adopted to not only greatly shorten a locking time of the phase-locked loop, but also can reduce the influence of capacitance mismatching of output loads on an oscillation frequency of the voltage-controlled oscillator, thereby improving the accuracy of the frequency.

5. In the radio-frequency transmission apparatus according to the present disclosure, a variable gain power amplifier thereof is comprised of a power driving stage and a power amplifying stage. The power driving stage uses a class AB of circuit structure, and the power amplifying stage uses a class B of complementary push-pull structure, which reduces the power consumption of the system while satisfying the requirements for linearity of the power amplifier. Inductance matching is achieved in an input of the power driving stage, which increases a gain of the transmitter, and when no radio-frequency signal is input, only the power driving stage has power consumption, which reduces transmission power consumption and improves transmission efficiency.

6. The radio-frequency transmission apparatus according to the present disclosure is particularly suitable for use in the field of wireless communications requiring high-speed low-power transmission applications.

DETAILED DESCRIPTION

In order to make the objects, technical solutions and advantages of the present disclosure more clear and obvious, the present disclosure will be further described in detail below in combination with specific embodiments and with reference to accompanying drawings.

Figure 1:
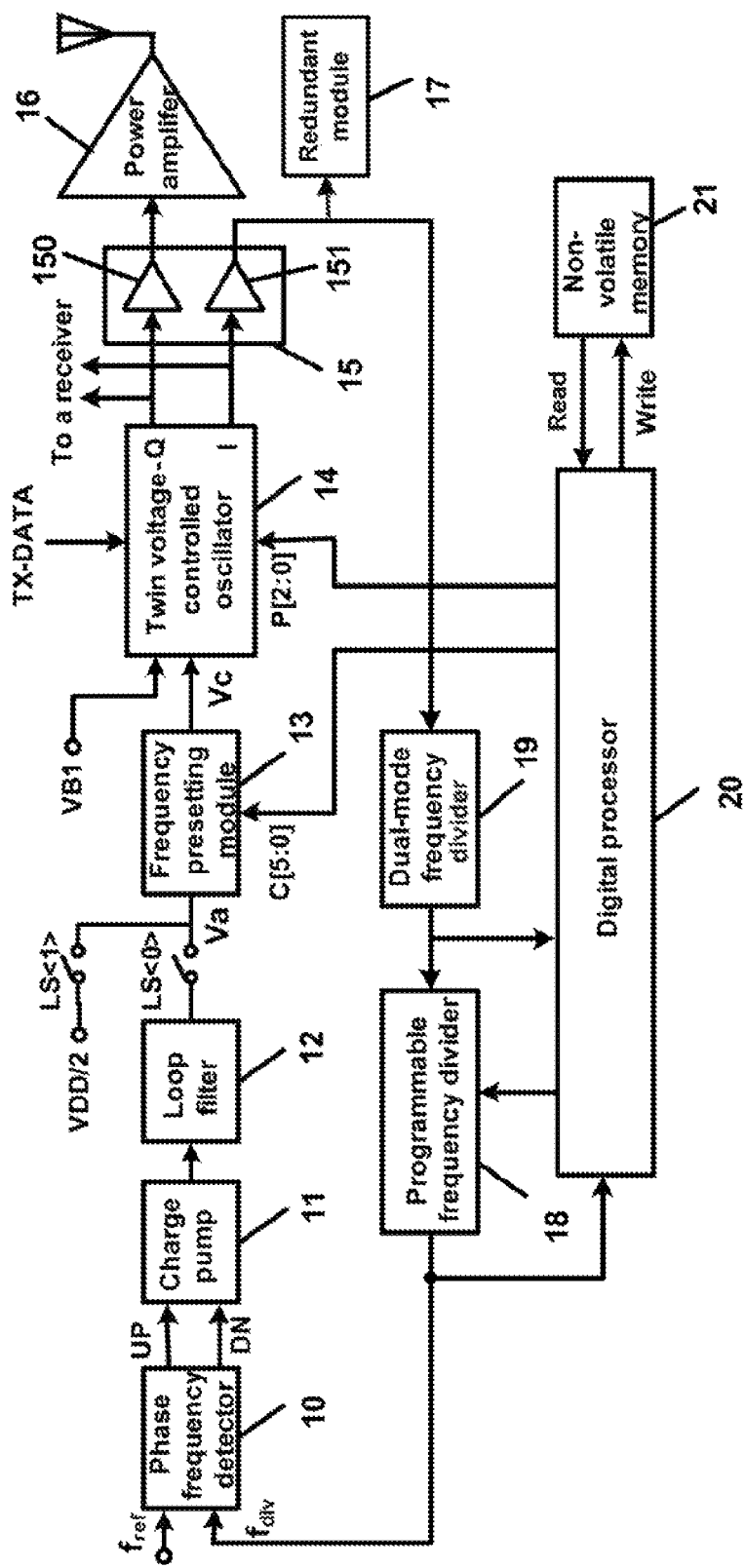
FIG. 1 is a high-speed wireless radio-frequency transmission apparatus according to the present disclosure.

FIG. 1 illustrates a system block diagram of a phase-locked loop based high-speed wireless radio-frequency transmission apparatus according to the present disclosure. The transmission apparatus is used to transmit a digital baseband signal modulated using frequency shift keying. As shown in FIG. 1, the radio-frequency transmission apparatus comprises a phase frequency detector 10, a charge pump 11, a loop filter 12, a frequency presetting module 13, a reconfigurable twin voltage-controlled oscillator 14, a buffer 15, a power amplifier 16, a redundant module 17, a programmable frequency divider 18, a dual-mode frequency divider 19, a digital processor 20, and a non-volatile memory 21.

The phase frequency detector 10 has a first input end for receiving a reference signal $f_{ref}$ which is input externally, a second input end for receiving an output signal $f_{div}$ of the programmable frequency divider 18, as well as a first output end UP and a second output end DN connected to an input end of the charge pump 11. The phase frequency detector 10 is used to compare a frequency and a phase of the input reference signal $f_{ref}$ with a frequency and a phase of the output signal $f_{div}$ of the programmable frequency divider 18 respectively. When the frequency of the reference signal $f_{ref}$ is greater than that of the output signal $f_{div}$ of the programmable frequency divider 18, the first output end UP of the phase frequency detector 10 generates a positive pulse and a signal outputted from the second output end DN is at a low level. When the frequency of the reference signal $f_{ref}$ is smaller than that of the output signal $f_{div}$ of the programmable frequency divider 18, the second output DN of the phase frequency detector 10 generates a positive pulse and a signal outputted from the first output end UP is at a low level. When the frequency of the reference signal $f_{ref}$ is equal to that of the output signal $f_{div}$ of the programmable frequency divider 18 and a phase difference therebetween is 0, signals output from the first output end UP and the second output end DN are at a low level.

The charge pump 11 has the input end connected to the first output end UP and the second output end DN of the phase frequency detector 10 and an output end connected to an input end of the loop filter 12. The charge pump 11 is controlled by an output signal of the phase frequency detector 10. When a positive pulse is generated at the first output end UP of the phase frequency detector 10, the charge pump 11 performs a charging operation and the output end thereof generates a charging current. When a positive pulse is generated at the second output end DN of the phase frequency detector 10, the charge pump 11 performs a discharging operation, and the output end thereof generates a discharging current. When both the first output end UP and the second output end DN of the phase frequency detector 10 are at a low level, the charge pump 11 performs neither charging nor discharging, and an output current thereof is 0.

The loop filter 12 has the input end connected to the output end of the charge pump 11 and an output end connected to an input end of the frequency presetting module 13. The loop filter 12 is used to convert the charging and discharging currents of the charge pump 11 into a control voltage Va for controlling the frequency presetting module 13. When the charge pump 11 generates a charging current, the control voltage Va at the output end of the loop filter 12 increases. When the charge pump 11 generates a discharging current, the control voltage Va at the output end of the loop filter 12 decreases. When neither a charging current nor a discharging current is generated at the output end of the charge pump 11, the control voltage Va at the output end of the loop filter 12 remains constant. A change in the control voltage Va directly affects variation in an output frequency of the twin voltage-controlled oscillator 14, that is, in the phase-locked loop, when Va increases, a control voltage Vc decreases, and when Va decreases, Vc increases.

An input end of the frequency presetting module 13 is connected to the output end Va of the loop filter 12 and a first output end C[5:0] of the digital processor 20, and is used to receive the analog control voltage Va outputted from the loop filter 12 and a first frequency preset control word C[5:0] outputted from the digital processor 20. An output end of the frequency presetting module 13 is connected to an input end of the reconfigurable twin voltage-controlled oscillator 14, and outputs the control voltage Vc for controlling frequency variation of the reconfigurable twin voltage-controlled oscillator 14. The control voltage Vc at the output end of the frequency presetting module 13 is determined by both the analog control end Va and the digital control end C[5:0], that is, the output frequency of the reconfigurable twin voltage-controlled oscillator 14 is determined by both the analog control ends Va and the first preset digital control word C[5:0]. When the transmitter is powered on, in a case that the voltage Va remains constant, corresponding output frequencies of the reconfigurable twin voltage-controlled oscillator 14 are obtained by sampling different values of the first frequency preset control word C[5:0], and thereby a corresponding relationship between C[5:0] and the output frequency of the reconfigurable twin voltage-controlled oscillator 14 is derived. When a frequency of the phase-locked loop is required to jump to a target frequency, a value of C[5:0] corresponding to the target frequency is calculated by the digital processor, and is then directly applied to the frequency presetting module 13. In this way, the output frequency of the reconfigurable twin voltage-controlled oscillator 14 is set to the target frequency, thereby shortening a locking time of the phase-locked loop.

The reconfigurable twin voltage-controlled oscillator 14 has the input end Vc connected to the output end of the frequency presetting module 13, a second output end P[2:0] of the digital processor 20, an external voltage VB1 and a transmission port TX-DATA, and an output end connected to an input end of the buffer 15. The input end Vc is used to control capacitance variation of a varactor in the reconfigurable twin voltage-controlled oscillator 14, so as to control oscillation frequency variation thereof. The second frequency preset control word P[2:0] output at the second output end of the digital processor 20 is used to control variation in an array of capacitors in the reconfigurable twin voltage-controlled oscillator 14, so as to change an operating frequency of the oscillator. The external voltage VB1 is used to control an operation mode of the reconfigurable twin voltage-controlled oscillator 14. When VB1 is at a low level, the reconfigurable twin voltage-controlled oscillator 14 operates in a transmission mode to transmit a digital modulated signal, and when VB1 is at a high level, the reconfigurable twin voltage-controlled oscillator 14 operates in a reception mode, and is equivalent to a quadrature oscillator to output quadrature carriers. The input end TX-DATA is used to apply the digital modulated signal to the reconfigurable twin voltage-controlled oscillator 14 in the transmission mode.

The buffer 15 comprises two buffers 150 and 151. The first buffer 150 has an input end connected to an output end of a q oscillator in the reconfigurable twin voltage-controlled oscillator 14, and an output end connected to the power amplifier 16. The second buffer 151 has an input end connected to an output end of an i oscillator in the reconfigurable twin voltage-controlled oscillator 14 and an output end connected to the dual-mode frequency divider 19. The buffer 15 is used to isolate the reconfigurable twin voltage-controlled oscillator 14 from the power amplifier 16 and the dual-mode frequency divider 19.

The power amplifier 16 has an input end connected to the output end of the first buffer 150, and an output end connected to an antenna. The power amplifier 16 is used to amplify an oscillation signal from the q oscillator in the reconfigurable twin voltage-controlled oscillator 14 which is outputted from the first buffer 150 and transmit the oscillation signal through the antenna.

The redundant module 17 is connected between the second buffer 151 and the dual-mode frequency divider 19, and has input load capacitance equal to input load capacitance of the power amplifier 16, so that load capacitance seen by the buffer 150 is the same as that seen by the buffer 151, which in turn enables load capacitances seen by the i oscillator and the q oscillator in the configurable twin voltage-controlled oscillator 14 to be the same.

The input end of the dual-mode frequency divider 19 is connected to the output end of the second buffer 151, and is used to perform first frequency division on the oscillation signal of the first oscillator in the configurable twin voltage-controlled oscillator 14 received from the second buffer 151, and output the divided signal to the programmable frequency divider 18.

The input end of the programmable frequency divider 18 is connected to an output end of the dual-mode frequency divider 19, and is used to perform further frequency division on the output signal of the dual-mode frequency divider 19 and output the divided signal to the phase frequency detector 10 and the digital processor 20. The signal output to the phase frequency detector 10 is used for comparison with the external reference signal $f_{ref}$ in terms of frequencies and phases to form a feedback loop. The signal output to the digital processor 20 is used as a work clock of the digital processor.

The digital processor 20 has an input end which is connected to an output end of the non-volatile memory 21 and is used to receive programming configuration data which is input externally, and an output end which is used to control the frequency presetting module 13, the reconfigurable twin voltage-controlled oscillator 14, the programmable frequency divider 18, and the non-volatile memory 21. The digital processor 20 samples an output frequency of the dual-mode frequency divider 19 when the chip is powered on, to calculate corresponding relationship between oscillation frequency of the reconfigurable twin voltage-controlled oscillator 14 and the first preset digital control word C[5:0], and a corresponding relationship between oscillation frequency of the reconfigurable twin voltage-controlled oscillator 14 and the second frequency preset control word P[2:0], and then stores the first frequency preset control word C[5:0] and the second frequency preset control word P[2:0] corresponding to different oscillation frequencies respectively in the non-volatile memory 21 for performing frequency presetting for the frequency presetting module 13 at the time of frequency hopping. Alternatively, C[5:0] and P[2:0] may also be configured through an external input. The frequency preset control word comprise a first frequency preset control word for controlling a current source in the frequency presetting module 13 and a second frequency preset control word for controlling the array of capacitors in the reconfigurable twin voltage-controlled oscillator 14. The digital processor 20 also generates a digital signal for controlling a frequency division ratio of the programmable frequency divider 18. The frequency preset control words are output to the non-volatile memory 21 for storage.

The non-volatile memory 21 has input and output ends connected to the input and output ends of the digital processor 16, and is used to store the first frequency preset control signal C[5:0] and the second frequency preset control signal P[2:0] calculated by the digital processor 20.

Figure 2:
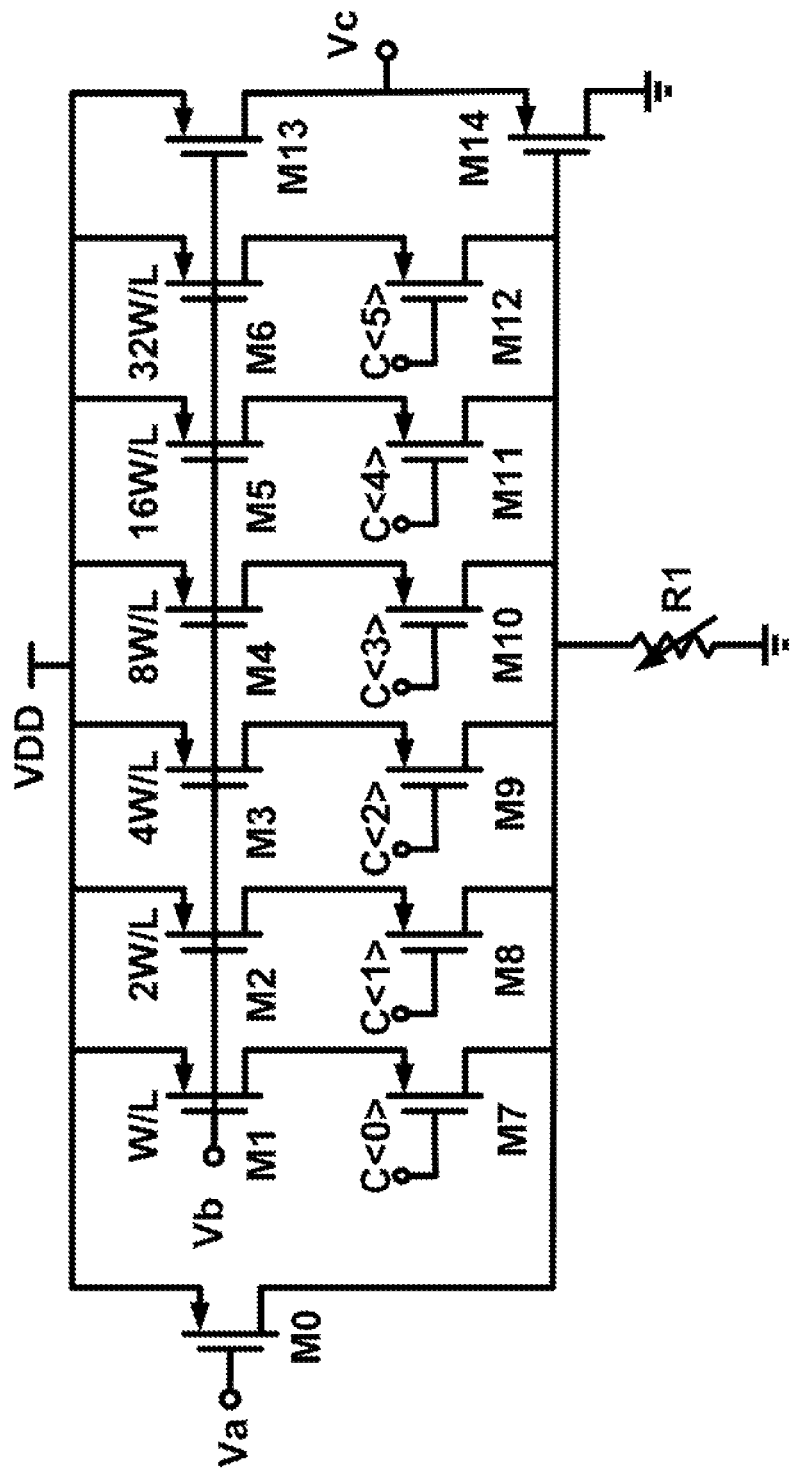
FIG. 2 is a circuit diagram of a frequency presetting module 13 according to the present disclosure.

Based on the system block diagram of the high-speed wireless radio-frequency transmission apparatus illustrated in FIG. 1, a circuit diagram of a frequency presetting module 13 according to the present disclosure is illustrated in FIG. 2. As shown in FIG. 2, the frequency presetting module 13 is used to preset the frequency of the voltage-controlled oscillator when frequency hopping occurs in the phase-locked loop, and comprises a resistor R1 and a plurality of MOS transistors M0, M1, M2, M3, M4, M5, M6, M7, M8, M9, M10, M11, M12, M13 and M14. M0 has a gate connected to the preset frequency control voltage Va outputted from the loop filter 12, a source connected to the supply voltage VDD, and a drain connected to a gate of M14 and one end of the resistor R1. The MOS transistors M1, M2, M3, M4, M5 and M6 have gates and sources respectively connected to a bias voltage Vb and the supply voltage VDD, and drains respectively connected to sources of the MOS transistors M7, M8, M9, M10, M11 and M12. The MOS transistors M7, M8, M9, M10, M11 and M12 have gates respectively connected to digital control signals C<0>, C<1>, C<2>, C<3>, C<4> and C<5>, and drains connected to the drain of M0, the gate of M14 and one end of the resistor R1. M14 has a drain connected to the ground, and a source is connected to a drain of M13. M13 has a gate and a source respectively connected to the bias voltage Vb and the supply voltage VDD. The MOS transistors M1, M2, M3, M4, M5 and M6 constitute a group of digital control current sources. The MOS transistors M7, M8, M9, M10, M11 and M12 are switches for controlling whether or not current from the current sources flows to the resistor R. The MOS transistors M1, M2, M3, M4, M5 and M6 have a width-to-length ratio which increases by an exponential order of 2, and therefore the group of digital control current sources has a current magnitude which increases by an exponential order of 2. The output current of the digital control current sources is converted into a voltage through the resistor R1. The transistors M13 and M14 constitute a source follower for buffering and outputting a voltage across the resistor R to Vc which is used to control the oscillation frequency of the reconfigurable twin voltage-controlled oscillator 14. When the chip is powered on, the digital processor 20 controls a switch LS<0> to turn off and a switch LS<1> to turn on. The frequency presetting module 13 controls the voltage Va to be connected to the bias voltage VDD/2. The digital processor 20 samples the output frequency of the twin oscillator 14, so that correspondence relationships between different oscillation frequencies of the voltage-controlled oscillator and the control word C[5:0] for the frequency presetting module 13 and the control word for the reconfigurable twin voltage-controlled oscillator 14 can be derived when the control voltage Va is a half of the supply voltage (VDD/2). At the time of frequency hopping, the frequency of the oscillator is preset to a frequency close to the target frequency by directly presetting C[5:0] and P[2:0]. The corresponding C[5:0] and P[2:0] at different sampled frequencies are stored in the non-volatile memory 21, then the digital processor 20 controls the switch LS<0> to turn on and the switch LS<1> to turn off, and the phase-locked loop enters a closed-loop mode. When the phase-locked loop needs to hop from the current oscillation frequency to the target frequency, the digital processor module 20 calculates values of the control word C[5:0] and P[2:0] corresponding to the target frequency using a linear interpolation algorithm. Then, C[5:0] is output to the frequency presetting module 13 and P[2:0] is output to the reconfigurable twin voltage-controlled oscillator 14 to preset the frequency of the reconfigurable twin voltage-controlled oscillator 14 to a value close to the target frequency. Next, fine locking is completely by a loop control voltage. In this way, the locking time of the phase-locked loop can be greatly shortened.

Figure 3:
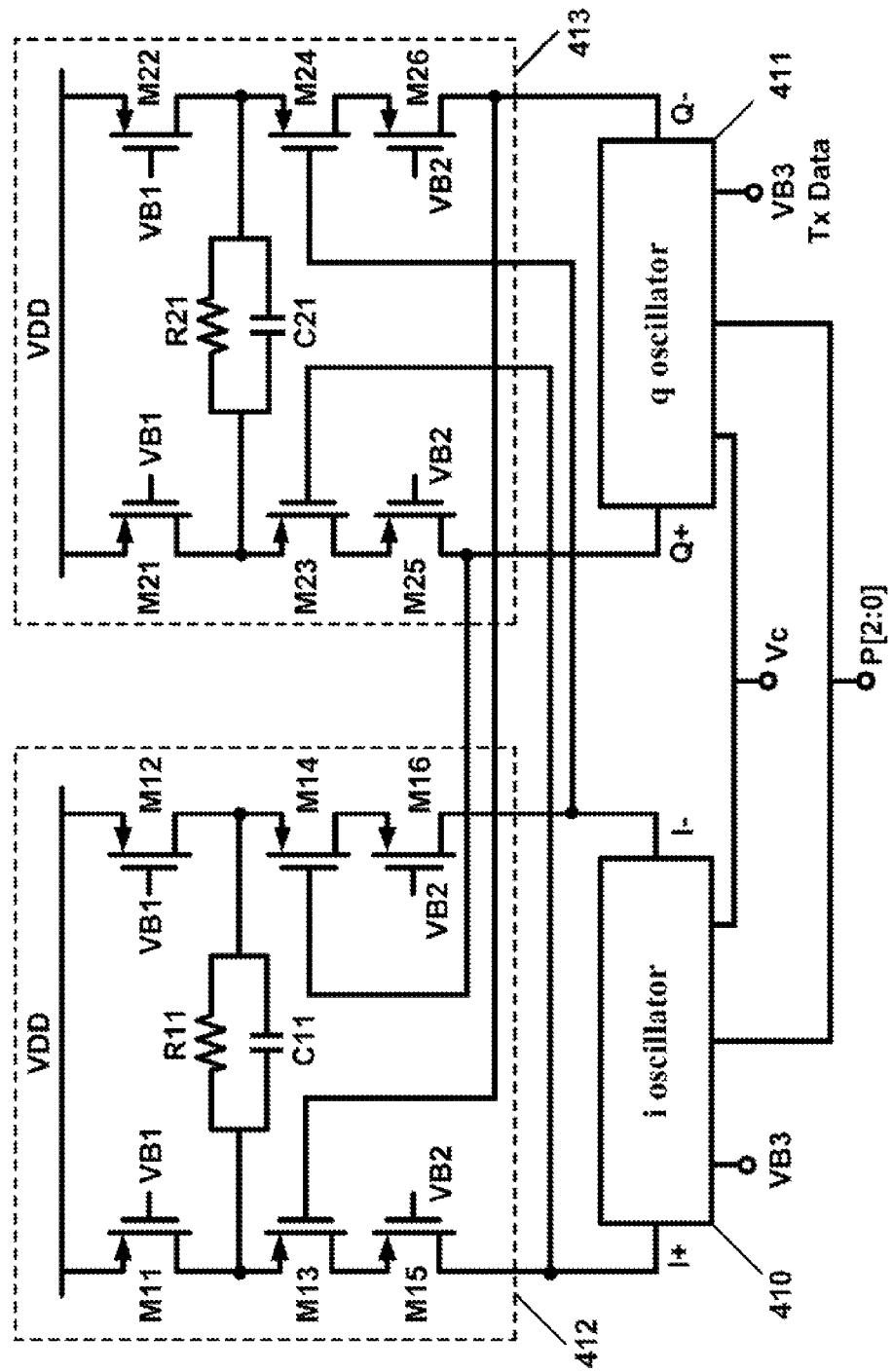
FIG. 3 is a circuit diagram of a twin voltage-controlled oscillator 14 according to the present disclosure.

Based on the system block diagram of the high-speed wireless radio-frequency transmission apparatus illustrated in FIG. 1, a circuit diagram of a twin voltage-controlled oscillator 14 according to the present disclosure is illustrated in FIG. 3. As shown in FIG. 3, the twin voltage-controlled oscillator 14 specifically comprises two independent and identical voltage-controlled oscillators which are an i oscillator 410 and a q oscillator 411, as well as two coupling branches, which are an i coupling branch 412 and a Q coupling branch 413. The twin voltage-controlled oscillator 14 has two operation modes, which are a reception mode and a transmission mode. In the reception mode, the i oscillator 410 and the q oscillator 411 are in a coupled state, in which case the reconfigurable twin voltage-controlled oscillator 14 is equivalent to a quadrature oscillator which may be used to generate quadrature carriers required by a receiver. In the transmission mode, the i oscillator 410 and the q oscillator 411 are decoupled and oscillate independently. The i oscillator is locked by the phase-locked loop, while the q oscillator is not locked by the phase-locked loop. A digital modulated signal to be transmitted is applied to the q oscillator to generate a frequency modulated signal. In this way, the data transmission rate is free from limitations due to a loop bandwidth of the phase-locked loop, an oscillation frequency of the i oscillator is locked and maintained to be stable by the phase-locked loop. As the i oscillator and the q oscillator have the same control voltage Vc, the oscillation frequency of the q oscillator is maintained to be consistent with the oscillation frequency of the i oscillator, and thus the transmission carrier frequency can be maintained to be stable while data is transmitted.

Specifically, a bias voltage VB3, a control word P[2:0], and a control voltage Vc are connected to the input ends of the i oscillator and the q oscillator, and output ports I+ and I− of the i oscillator 410 are connected to the i coupling branch 412 and the q coupling branch 413, and output ports Q+ and Q− of the q oscillator 411 are connected to the q coupling branch 413 and the i coupling branch 412. The i coupling branch 412 is comprised of a resistor R11, a capacitor C1, and MOS transistors M11, M12, M13, M14, M15 and M16. M11 and M12 have sources connected to a supply voltage VDD, gates connected to a bias voltage VB1, and drains respectively connected to sources of M13 and M14. The resistor R11 is connected in parallel to the capacitor C11. The resistor R11 has one end connected to the drain of M11, and the other end connected to the drain of M12. M13 and M14 have gates respectively connected to the output end Q− and the output end Q+ of the q oscillator 411, and drains respectively connected to sources of M15 and M16. M15 and M16 have gates connected to a bias voltage VB2, and drains respectively connected to the output end I+ and the output end I− of the i oscillator 410. The q coupling branch 413 is comprised of a resistor R21, a capacitor C21, and MOS transistors M21, M22, M23, M24, M25 and M26. M21 and M22 have sources connected to the supply voltage VDD, gates connected to the bias voltage VB1, and drains respectively connected to sources of M23 and M24. The resistor R21 is connected in parallel to the capacitor C21. The resistor R21 has one end connected to the drain of M21, and the other end connected to the drain of M22. M23 and M24 have gates respectively connected to the output end I+ and the output end I− of the i oscillator 410, and drains respectively connected to sources of M25 and M26. M25 and M26 have gates connected to the bias voltage VB2, and drains respectively connected to the output end Q+ and the output end Q− of the q oscillator 411. The i oscillator and the q oscillator are two cross-coupled negative-resistance LC voltage-controlled oscillators which have the same structure and are controlled by the same control voltage Vc. The LC voltage-controlled oscillator uses a cross-coupled negative resistance technology, and uses a 3-bit digital control array of capacitors to expand a tuning range of the voltage-controlled oscillator. The reconfigurable twin voltage-controlled oscillator 14 has two operation modes, which are a reception mode and a transmission mode. Switching between these two operation modes is achieved by switching the bias voltage VB1.

When the reconfigurable twin voltage-controlled oscillator 14 is in the reception mode, the bias voltage VB1 is connected to a fixed bias voltage, and current sources (M11, M12, M21 and M22) of the coupling branches are turned on. In this case, the i oscillator and the q oscillator are coupled to each other through the coupling branches, and may be equivalent to a quadrature oscillator. Therefore, output signals of the i oscillator and the q oscillator have the same frequency but quadrature phases. The parallel resistors and capacitors (R11-C11 and R22-C22) on the coupling paths are used to avoid the dual-mode oscillation effect in the quadrature voltage-controlled oscillator.

When the reconfigurable twin voltage-controlled oscillator 14 is in the transmission mode, the bias voltage VB1 is connected to the supply voltage, and current sources (M11, M12, M21 and M22) of the coupling branches are turned off. In this case, the i oscillator and the q oscillator are no longer equivalent to a quadrature oscillator, i.e., the i oscillator and q oscillator are decoupled, and are in separate oscillation states. The output ends I+ and I− of the i oscillator are connected to the phase-locked loop through the buffer 15, and the output ends Q+ and Q− of the q oscillator are connected to the power amplifier 16 through the buffer 15. As the i oscillator and the q oscillator are controlled by the control voltage Vc at the same oscillation frequency, the oscillation frequency of the q oscillator changes with the oscillation frequency of the i oscillator. The transmitted baseband data is applied to the VB3 port of the q oscillator. In this way, a data transmission rate is free from limitations due to a loop bandwidth of the phase-locked loop and the transmitted carrier frequency is maintained to be stable. The existing phase-locked loop-based transmitter is mainly implemented in four ways: modulation and transmission with a closed-loop frequency divider, modulation and transmission with a closed-loop voltage-controlled oscillator, two-point modulation and transmission, and modulation and transmission with an open-loop voltage-controlled oscillator.

For a structure of the modulation and transmission with a closed-loop frequency divider, a data transmission rate is limited by a loop bandwidth of the phase-locked loop, which makes it difficult to achieve a relatively high data transmission rate. A structure of the modulation and transmission with a closed-loop voltage-controlled oscillator has disadvantages that low-frequency components of the transmitted data may be lost or distorted. A structure of the two-point modulation combines the advantages of the modulation and transmission with a closed-loop frequency divider and the modulation and transmission with a closed-loop voltage-controlled oscillator, while avoiding their respective disadvantages. However, mismatching of gains and phases may affect the quality of the transmitted signal, the design is complex, and the power consumption is large. For a structure of modulation and transmission with an open-loop voltage-controlled oscillator, a transmitted carrier is susceptible to leakage current and external noise interference. Further, this structure is not suitable for continuous modulation and transmission, and therefore, an amount of transmitted data is limited.

The phase-locked loop transmitter according to the present disclosure adopts a twin voltage-controlled oscillator-based structure, which can enable the transmitted carrier to be stable during transmission, thereby avoiding the problem of frequency drift for the modulation and transmission with an open-loop voltage-controlled oscillator, and can achieve a relatively high data transmission rate at the same time, thereby avoiding the problem of limitations of the transmission rate by the loop bandwidth of the phase-locked loop for the modulation and transmission with a closed-loop frequency divider.

Figure 4:
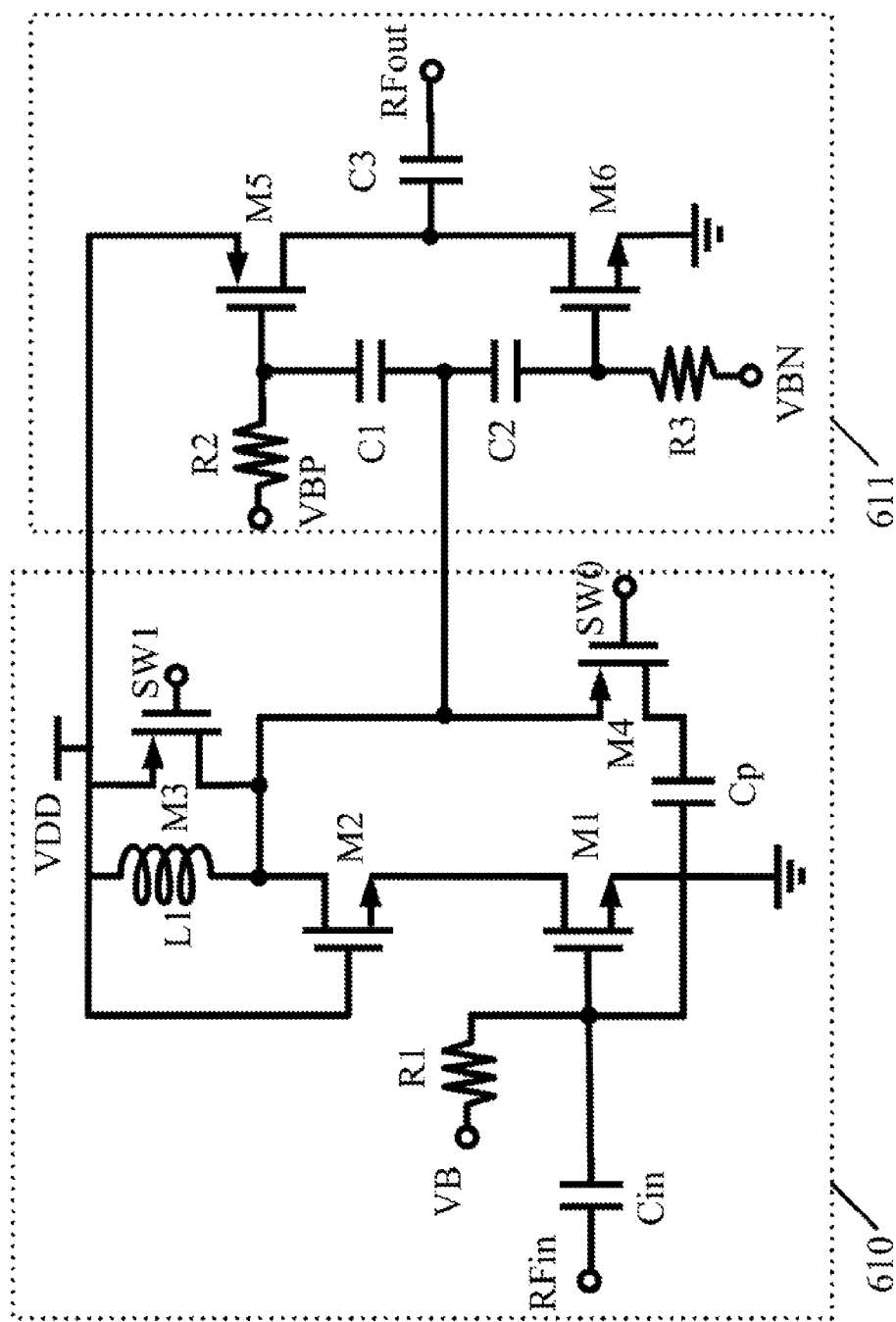
FIG. 4 is a circuit structural diagram of a power amplifier 16 according to the present disclosure.

Based on the system block diagram of the high-speed wireless radio-frequency transmission apparatus illustrated in FIG. 1, FIG. 4 illustrates a circuit diagram of a power amplifier 16 according to the present disclosure. As shown in FIG. 4, the power amplifier 16 is comprised of a driving stage circuit 610 and an output stage circuit 611, and is used to transmit a radio-frequency modulated signal generated by the q oscillator. The driving stage 610 is comprised of capacitors Cin and Cp, an inductor L1, a resistor R1, and MOS transistors M1, M2, M3 and M4. The capacitor Cin has one end connected to the radio-frequency signal RFin and the other end connected to a gate of the MOS transistor M1. The resistor R1 has one end connected to the bias voltage VB, and the other end connected to the gate of M1. The capacitor Cp has one end connected to the gate of M1, and the other end connected to a drain of the MOS transistor M4. The MOS transistor M1 has a source connected to the ground, and a drain connected to a source of the MOS transistor M2. The MOS transistor M2 has a drain connected to the inductor L1 and a drain of the MOS transistor M3, and a gate connected to the power supply VDD. The inductor L1 has one end connected to the power supply VDD, and the other end connected to the drain of M2. M3 has the drain connected to the drain of M2, and a gate connected to a switch signal SW1. M4 has the drain connected to one end of the capacitor Cp, a source connected to the drain of M2, and a gate connected to a switch signal SW0. The output stage 611 is comprised of capacitors C1, C2 and C3, resistors R2 and R3 as well as MOS transistors M5 and M6. The capacitor C1 has one end connected to C2, and the other end connected to a gate of M5. The other end of the capacitor C2 is connected to a gate of M6. The resistor R2 has one end connected to a bis voltage VBP, and the other end connected to the gate of M5. The resistor R3 has one end connected to a bias voltage VBN, and the other end connected to the gate of M6. M6 has a source connected to the ground, and a drain connected to a drain of M5. A source of M5 is connected to the supply voltage VDD. The capacitor C3 has one end connected to the drains of M5 and M6, and the other end connected to an output end RFout.

In the power amplifier 16, the driving stage circuit 610 is used to preliminarily amplify the radio-frequency signal to provide a large voltage signal swing, and the output stage circuit 611 is used to drive a 50Ω antenna load outside the chip. Switches SW0 and SW1 are used to achieve gain control at three levels (a high gain, a medium gain and a low gain) and can provide a gain control range of 20 dB. When SW0 and SW1 are at high levels, the power amplifier 16 is in a high gain mode; when SW0 is at a high level and SW1 is at a low level, the power amplifier 16 is in a medium gain mode; and when SW0 is at a low level and SW1 is in at a high level, the power amplifier 16 is in a low gain mode. The MOS transistors M5 and M6 of the output stage 611 operate at a sub-threshold point by setting the bias voltages VBP and VBN to reduce quiescent current consumption and improve the efficiency of the power amplifier.

The purposes, technical solutions and advantageous effects of the present disclosure are further described in detail in the specific embodiments described above. It is to be understood that the description above is merely specific embodiments of the present disclosure, and is not intended to limit the present disclosure. Any modifications, equivalent substitutions, improvements etc. made within the spirit and principles of the present disclosure are intended to be included within the protection scope of the present disclosure.

We claim:

1. A wireless radio-frequency transceiver apparatus, comprising:
   a phase frequency detector;
   a charge pump;
   a loop filter; and
   a twin voltage-controlled oscillator,
   wherein the twin voltage-controlled oscillator comprises a first voltage-controlled oscillator and a second voltage-controlled oscillator which are of the same structure,
   wherein the twin voltage-controlled oscillator further comprises and a first coupling branch and a second coupling branch,
   wherein the first voltage-controlled oscillator has an output end connected to input ends of the first coupling branch and the second coupling branch respectively, and the second voltage-controlled oscillator has an output end connected to the input ends of the first coupling branch and the second coupling branch respectively,
   wherein after current is applied to the first coupling branch and the second coupling branch, the first voltage-controlled oscillator and the second voltage-controlled oscillator are coupled through the first coupling branch and the second coupling branch to form the quadrature voltage-controlled oscillator and the twin voltage-controlled oscillator is switched to a reception mode, in the reception mode the first voltage-controlled oscillator and the second voltage-controlled oscillator are coupled to each other to form a quadrature voltage-controlled oscillator, and the quadrature voltage-controlled oscillator, the phase frequency detector, the charge pump and the loop filter constitute a phase-locked loop to generate quadrature carriers for receiving information,
   wherein after the current is cut off from the first coupling branch and the second coupling branch, the first voltage-controlled oscillator and the second voltage-controlled oscillator are decoupled and the twin voltage-controlled oscillator is switched to a transmission mode, in the transmission mode the first voltage-controlled oscillator, the phase frequency detector, the charge pump and the loop filter constitute a phase-locked loop, and the second voltage-controlled oscillator is used for performing frequency modulation on transmitted data.

2. The apparatus according to claim 1, wherein oscillation frequencies of the first voltage-controlled oscillator and the second voltage-controlled oscillator are controlled by a first frequency control signal.

3. The apparatus according to claim 2, wherein the phase frequency detector, the charge pump and the loop filter adjust the first frequency control signal according to a feedback value of an output frequency of the twin voltage-controlled oscillator.

4. The apparatus according to claim 2, further comprising:
   a frequency presetting module configured to preset a frequency of the twin voltage-controlled oscillator when frequency hopping occurs in the twin voltage-controlled oscillator.

5. The apparatus according to claim 4, wherein the frequency presetting module changes the first frequency control signal according to a first frequency preset control word.

6. The apparatus according to claim 5, wherein the oscillation frequencies of the first voltage-controlled oscillator and the second voltage-controlled oscillator are further controlled by a second frequency preset control word.

7. The apparatus according to claim 6, wherein the first frequency preset control word and the second frequency preset control word are preset according to a target frequency to which the twin voltage-controlled oscillator is intended to hop.

8. The apparatus according to claim 7, further comprising:
a digital processor configured to sample the output frequency of the twin voltage-controlled oscillator when the digital processor is powered-on, to acquire a corresponding relationship between the output frequency of the twin voltage-controlled oscillator and the first frequency preset control word, and to acquire a corresponding relationship between the output frequency of the twin voltage-controlled oscillator and the second frequency preset control word.

* * * * *